United States Patent
Chang

(10) Patent No.: US 9,263,231 B2
(45) Date of Patent: Feb. 16, 2016

(54) MOVEABLE CURRENT SENSOR FOR INCREASING ION BEAM UTILIZATION DURING ION IMPLANTATION

(71) Applicant: Varian Semiconductor Equipment Associates, Inc., Gloucester, MA (US)

(72) Inventor: Shengwu Chang, South Hamilton, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 0 days.

(21) Appl. No.: 14/050,952

(22) Filed: Oct. 10, 2013

(65) Prior Publication Data

US 2015/0104885 A1    Apr. 16, 2015

(51) Int. Cl.
*H01J 37/20* (2006.01)
*H01L 21/26* (2006.01)
*H01J 37/244* (2006.01)
*H01L 21/265* (2006.01)
*H01J 37/317* (2006.01)

(52) U.S. Cl.
CPC ........... *H01J 37/244* (2013.01); *H01J 37/3171* (2013.01); *H01L 21/265* (2013.01)

(58) Field of Classification Search
CPC ................... H01J 37/3171; H01J 2237/20207;
H01J 2237/31703; H01J 2237/30455; H01J 2237/30483; H01J 37/20; H01J 2237/20228; H01J 2237/20235; H01J 2237/206
USPC .............. 438/5, 514; 250/492.21, 397, 492.3, 250/288, 269.1; 257/E21.09, E21.211, 257/E21.334
See application file for complete search history.

(56) References Cited

U.S. PATENT DOCUMENTS

| | | | |
|---|---|---|---|
| 4,980,562 A | | 12/1990 | Berrian et al. |
| 6,130,427 A | * | 10/2000 | Park et al. ........................ 850/26 |
| 6,580,083 B2 | | 6/2003 | Berrian |
| 2002/0109106 A1 | * | 8/2002 | Berrian et al. ............ 250/492.21 |
| 2007/0080302 A1 | * | 4/2007 | Hwang .......................... 250/397 |
| 2007/0105355 A1 | * | 5/2007 | Murrell et al. ................ 438/535 |
| 2009/0032726 A1 | * | 2/2009 | Sieradzki et al. ............. 250/400 |
| 2009/0242808 A1 | * | 10/2009 | Evans ....................... 250/492.21 |
| 2012/0280137 A1 | * | 11/2012 | Chen et al. ..................... 250/397 |

* cited by examiner

*Primary Examiner* — Calvin Choi
*Assistant Examiner* — Xiaoming Liu

(57) ABSTRACT

An ion implant apparatus and moveable ion beam current sensor are described. Various examples provide moving the ion beam current sensor during an ion implant process such that a distance between the ion beam current sensor and a substrate is maintained during scanning of the ion beam toward the substrate. The ion beam current sensor is disposed on a moveable support configured to move the ion beam current sensor in a first direction corresponding to the scanning of the ion beam while the substrate is moved in a second direction.

20 Claims, 5 Drawing Sheets

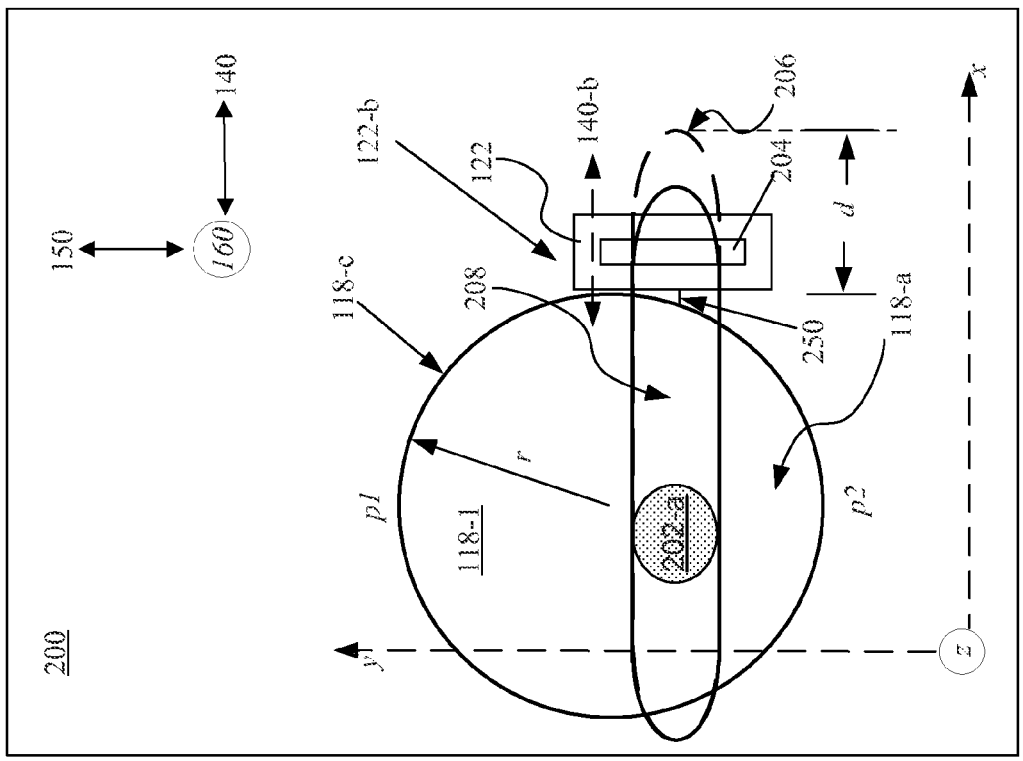
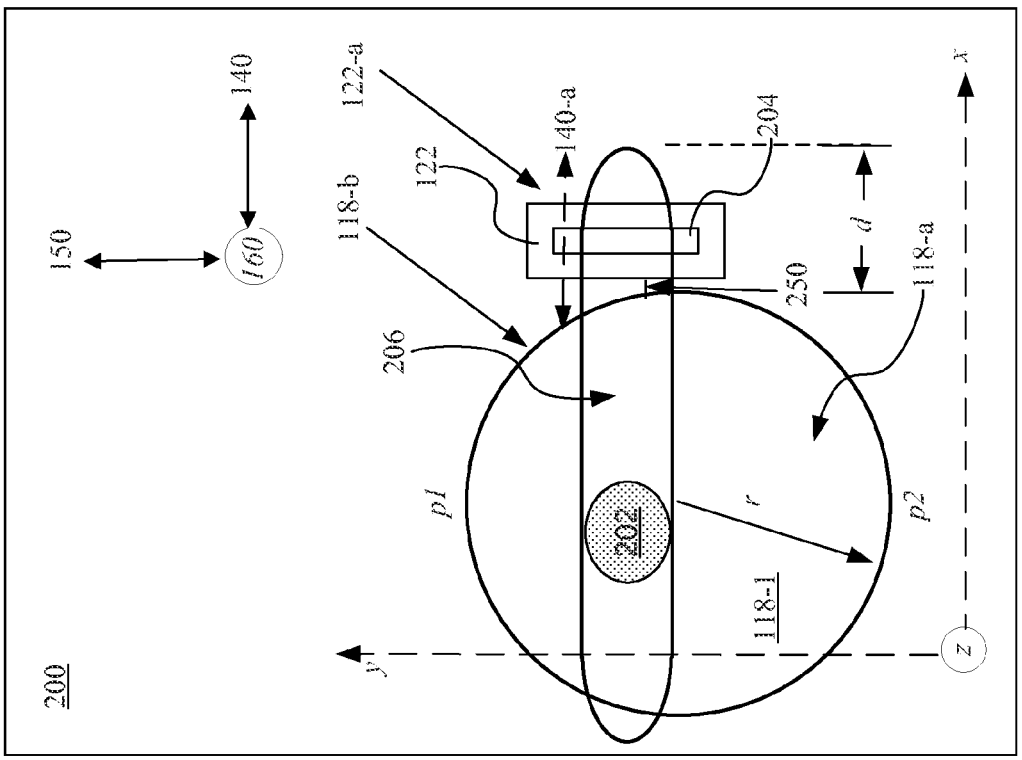

MOVEABLE CURRENT SENSOR FOR INCREASING ION BEAM UTILIZATION DURING ION IMPLANTATION

FIELD OF THE DISCLOSURE

Embodiments of the present disclosure relate generally to semiconductor manufacturing, and more particularly to increasing ion beam utilization during an ion implantation processing.

BACKGROUND OF THE DISCLOSURE

Ion implantation is a process used to dope impurity ions into a substrate to obtain desired device characteristics. Typically, an ion beam is extracted from an ion source chamber toward a substrate. The depth of implantation of the ions into the substrate is based on the ion implant energy and the mass of the ions generated. One or more ion species may be implanted at different energy and dose levels to obtain desired device structures. In addition, the beam dose (the amount of ions implanted in the substrate) and the beam current (the uniformity of the ion beam) can be manipulated to provide a desired doping profile in the substrate. The current density of the beam and the time that a substrate is exposed to the ion beam determines the dose.

An ion implanter may generate an ion beam having a roughly circular or elliptical cross sectional shape that is smaller than the surface of the substrate to be treated. The substrate to be treated such as, for example, a semiconductor substrate may have a disk shape. In order to implant ions into substantially all of the substrate, the ion beam is scanned back and forth across the substrate at scanning frequencies up to 1 kHz. In particular, an angle corrector may be included in the implanter that is configured to accept the scanned spot beam with diverging trajectories and corrects the trajectories to provide parallel trajectories directed toward the substrate. The substrate may be mechanically driven in a direction orthogonal to the direction of the scan plane in order to treat substantially all of the surface of the substrate. For example, if the scan plane is a horizontal plane the substrate may be mechanically driven in a vertical direction so the entirety of a front surface of the substrate is treated with the ion beam as it is scanned back and forth horizontally across the surface.

The scan rate of the ion beam may be controlled to obtain a desired beam dose and consequently a particular doping profile for the substrate. The beam dose may be controlled using real time dose control techniques, such as, for example, orthogonal scan compensation (OSC), which is used to measure the beam current at various points during implantation. The time that a particular portion of the substrate is exposed to the ion spot beam can then be adjusted based on the measured beam current to ensure that the desired beam dose is consistent over the entire substrate. Thus, measuring the beam current during substrate processing requires that the ion beam be scanned a sufficient distance off of the substrate and over a fixed beam current sensor, such as, for example, a Faraday cup to provide real time dose information. However, because beam current sensors may be in a fixed position and the front surface of the disk shaped wafer typically has a substantially circular perimeter, the ion beam spends a certain amount of time off the wafer in order for the beam to be incident on the sensor. This is sometimes referred to as "oversweep" where the beam sweeps outside or off the surface of the wafer. This may result in lower beam utilization. In particular, the ratio of the substrate area to the ion implant area (i.e. the area the ion beam is swept over) is referred to as "ion beam utilization." Thus, the more the ion beam is not incident on the substrate, the lower the ion beam utilization. The lower the ion beam utilization, the lower the device manufacturing throughput. As such, extra time and/or materials are required for ion implant processes that have lower ion beam utilization than would be for ion implant processes having higher ion beam utilization. Thus, there is a need to increase ion beam utilization. It is with respect to these and other considerations that the present improvements have been needed.

SUMMARY

This Summary is provided to introduce a selection of concepts in a simplified form that are further described below in the Detailed Description. This Summary is not intended to identify key features or essential features of the claimed subject matter, nor is it intended as an aid in determining the scope of the claimed subject matter.

In general, various embodiments of the present disclosure provide an ion implant apparatus comprising an ion source configured to generate an ion beam which is scanned back and forth in a first direction in a scan plane. A platen supports a substrate when the substrate is treated with the ion beam and is configured to drive the substrate in a second direction orthogonal to the scan plane where the front surface of the substrate defines a substrate plane. An ion beam current sensor is disposed adjacent to the substrate in the substrate plane, and a support is configured to move the ion beam current sensor in the first direction in response to a relative position of the substrate along the second direction.

As another example, some embodiments provide a method for implanting ions in a substrate comprising generating an ion beam, scanning the ion beam in a first direction, scanning the ion beam over an ion beam current sensor located adjacent to a substrate, driving the substrate in a second direction orthogonal to the first direction, and moving the ion beam current sensor in the first direction in response to a relative position of the substrate along the second direction.

As another example, some embodiments may provide an ion beam current sensor apparatus comprising an ion beam current sensor configured to measure current of an ion beam when the ion beam is scanned back and forth in a first direction and used to treat a substrate supported on a platen, the front surface of the substrate defining a substrate plane, and a support configured to move the ion beam current sensor in the first direction in response to a relative position of the substrate along a second direction, the second direction orthogonal to the first direction.

BRIEF DESCRIPTION OF THE DRAWINGS

By way of example, various embodiments of the disclosed device will now be described, with reference to the accompanying drawings, in which:

FIGS. 2A-2D are block diagrams of a top view of a portion of the ion implant apparatus shown in FIG. 1B;

DETAILED DESCRIPTION

Figure 1A:
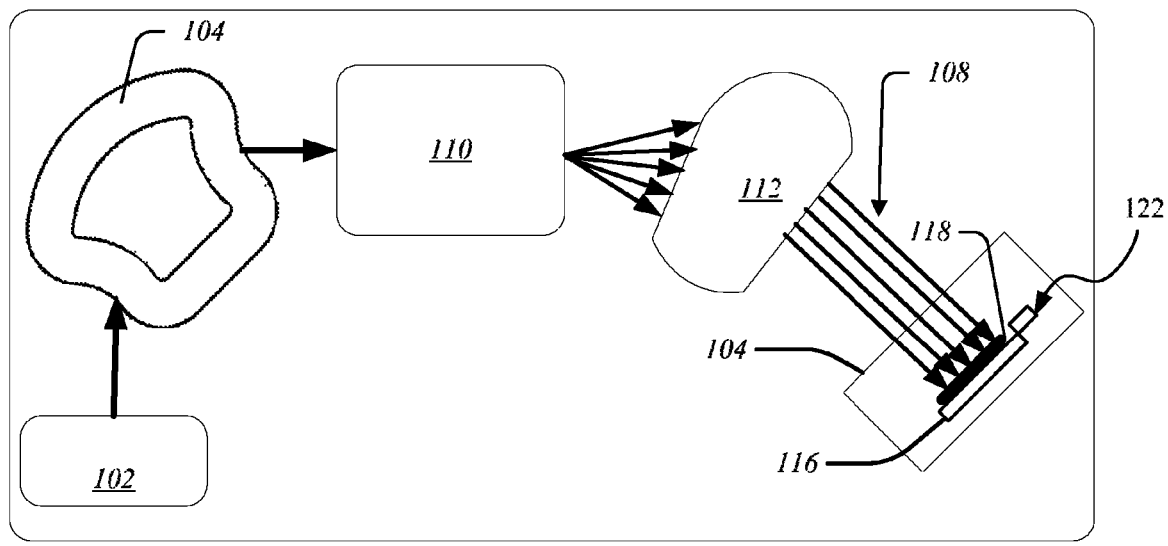
FIG. 1A is a block diagrams (not drawn to scale) of an ion implant apparatus having a moveable ion beam current sensor.

FIG. 1A is a block diagram generally illustrating an exemplary ion implant apparatus 100 configured to provide an ion beam 108 to a substrate 118. The implant apparatus 100 may include various conventional components including an ion source 102, analyzer magnetic 104, corrector magnet 112 and processing chamber 104. In various embodiments, the ion implanter 100 generates the ion beam 108 as a spot type ion beam in response to the introduction of one or more particular feed gases having desired species to ion source 102. The ion implanter 100 may include various additional beam processing components that shape, focus, accelerate, decelerate, and bend the ion beam 108 as it propagates from the ion source 102 to substrate 118. For example, an electrostatic scanner 110 may be provided to scan the ion beam 108 in a first direction with respect to the substrate 118 in a scan plane as discussed in detail below. The process chamber 104 includes a platen 116 configured to hold substrate 118 during processing and an ion current beam sensor 122 in accordance with the present disclosure.

Figure 1B:
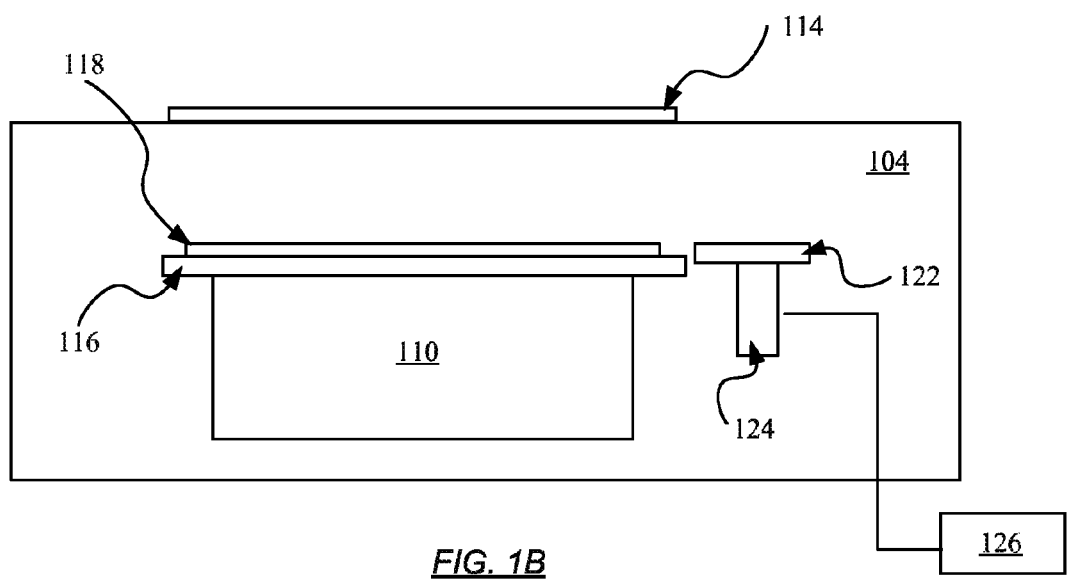
FIG. 1B is a block diagram (not drawn to scale) of an exemplary process chamber shown in FIG. 1A.

FIG. 1B is a block diagram of the exemplary process chamber 104 which includes an aperture 114, through which the ion beam 108 is transmitted to substrate 118, and a drive assembly 110 attached to the platen 116 configured to move the platen (and consequently the substrate 118) in a second direction orthogonal to the first direction while the ion beam 108 is swept (also referred to herein as "scanned") back and forth in the first direction. In particular, during an ion implantation process, the ion beam 108 is incident on the substrate 118 in a direction that is orthogonal to the surface of the substrate 118 which is conventionally referred to as the z direction. The ions in the ion beam 108 penetrate the substrate 118 and come to rest beneath the surface to form a region of desired conductivity. The ion beam 108 may be scanned in the first direction, and the substrate 118 is moved (via the drive assembly 110) in the second direction orthogonal to the first or scanning direction. The area of the substrate 118 that the ion beam 108 is scanned over during an ion implantation process is generally referred to herein as the "scanned area" which is intended to be substantially all of the usable substrate area plus additional area (explained in greater detail below). The ion beam utilization is the ratio of the area of the substrate 118 to the scanned area. For example, if the substrate 118 is a 300 mm diameter disk shaped substrate where the front surface has an area of about 471 mm² and the scanned area was 1,000 mm², the ion beam utilization would be 47.1%.

The beam dose refers to the quantity of ions implanted into the substrate 118 via ion beam 108, which is dependent upon the beam current as well as the amount of time the substrate 118 is exposed to the ion beam 108 as the substrate is scanned. In order to ensure the beam dose corresponds to a desired recipe, the ion implant apparatus 100 includes an ion beam current sensor 122 positioned on a support 124. In some examples, the ion beam current sensor 122 may be a Faraday cup having a Faraday pixel configured to measure ion beam current as an ion beam (e.g., the ion beam 108) is incident on the Faraday pixel. Typically, the current sensor may be disposed in place of the substrate 118 in order to ensure that the dose of ion beam 108 is consistent with the desired recipe. Once the beam dose is confirmed, the current sensor 122 is removed from the beam line and replaced with a substrate to undergo implantation. In an alternative embodiment, a separate current sensor may be used in place of current sensor 122 when the current sensor replaces the substrate 118 to ensure that the dose of the ion beam 108 is consistent with the desired recipe.

The ion beam current sensor 122 may also be configured to detect the beam current during an ion implantation process. In order to detect the beam current, the ion beam 108 needs to be scanned outside the boundary of the substrate to ensure that the ion beam is incident on the ion beam current sensor 122 during the implant process. A controller 126 may be communicatively coupled to the ion beam current sensor 122 and configured to adjust various parameters of the ion implant process such as, for example, the scan speed of ion beam 108, movement of the substrate 118, based on feedback from the ion beam current sensor 122.

In order to increase the ion beam utilization, the ion beam current sensor 122 is configured to be moveable using the support 124 to be contiguous with the perimeter of the substrate 118. As is more fully described with reference to FIGS. 2A-2D, the ion beam current sensor 122 can be configured to move in the direction parallel to the movement direction of the substrate 118 and orthogonal to the incident angle of the ion beam 108. Moving the ion beam current sensor 122 in conjunction with the substrate 118 may reduce the distance that the ion beam 118 needs to be scanned off the substrate 118 in order to reach the ion beam current sensor 122 (e.g., for purposes of measuring the ion beam current). As such, the scanned area may be reduced and the ion beam utilization may be increased.

Figure 1C:
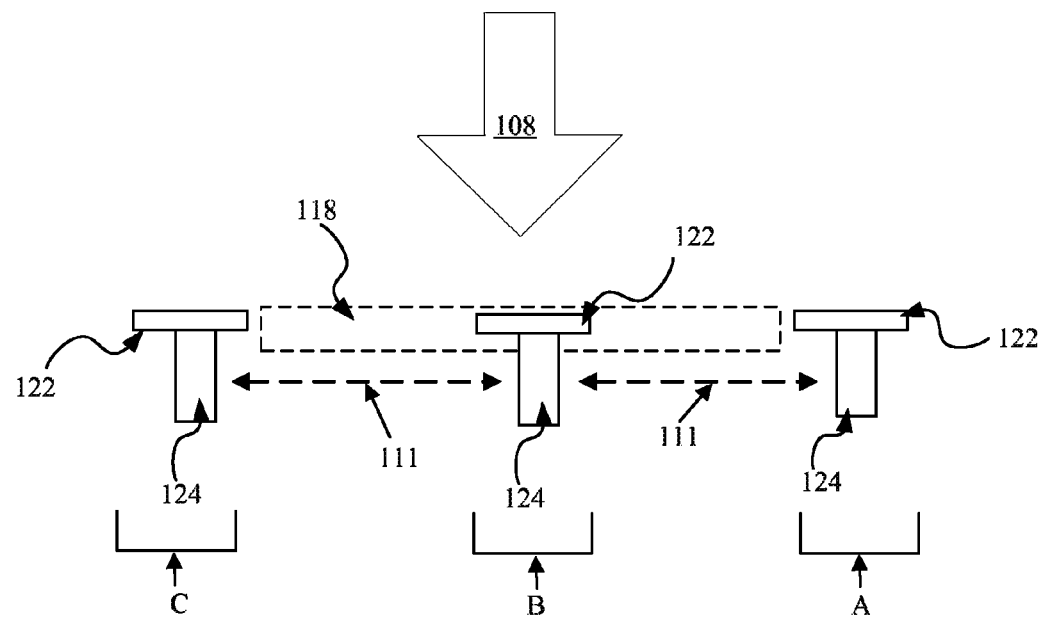
FIGS. 1C and 1D are schematic illustrations of the displacement of the ion beam current sensor.

FIG. 1C is a schematic illustration of the use of the same ion beam current sensor 122 disposed in place of the substrate 118. In particular, sensor 122 may be disposed in the path of ion beam 108 in place of substrate 118 (shown in shadow) and displaced along the length of substrate before implantation of substrate 118 in order to ensure that the dose of ion beam 108 is consistent with the desired recipe. Ion current sensor 122 is depicted in exemplary positions A, B and C as it travels back and forth in the direction depicted by arrows 111 which is orthogonal to the direction of ion beam 108. As mentioned above, once the beam dose is confirmed the current sensor 122 is removed from the beam line and replaced with substrate 118 to undergo implantation.

Figure 1D:
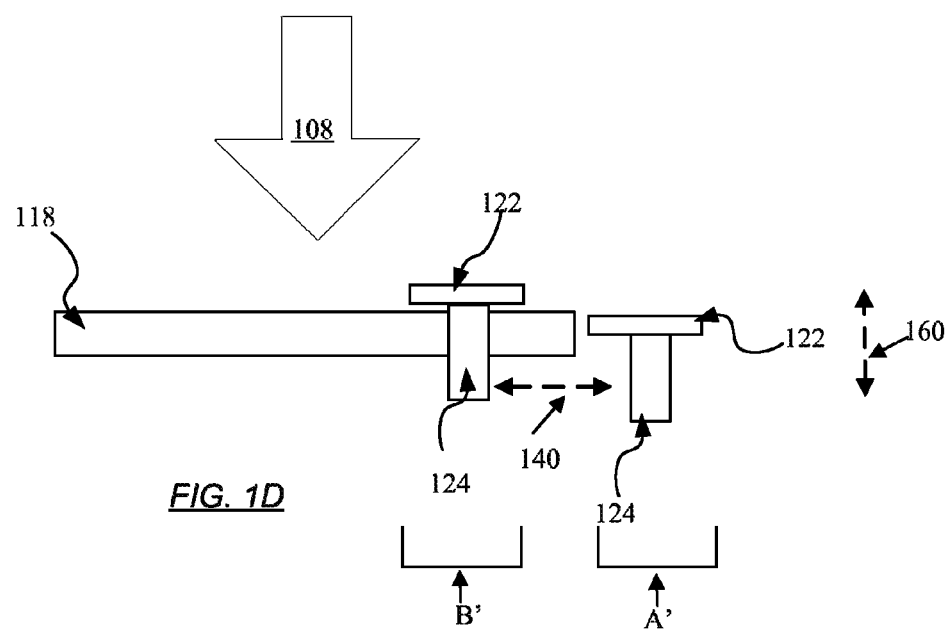

FIG. 1D is a schematic illustration of the same ion beam current sensor 122 shown in FIG. 1C that is also used to monitor beam current during implantation. As described in more detail below with respect to FIGS. 2A-2D, the ion beam current sensor 122 is displaced in the direction illustrated by arrow 140 to be contiguous with the perimeter of the substrate 118 as the substrate 118 is scanned. Ion current sensor 122 is depicted in exemplary positions A' and B' as it travels back and forth in the direction depicted by arrows 140 which is orthogonal to the direction of ion beam 108. In addition, the ion beam current sensor 122 is displaced in the direction illustrated by arrow 160 to be disposed in front of substrate 118 with respect to the direction of travel of the ion beam 108. In particular, at position A' the ion beam current sensor is essentially on the same plane as substrate 118. When the ion beam current sensor 122 is displaced in the direction illustrated by arrow 140 to be contiguous with the perimeter of the substrate 118, the ion beam current sensor 122 would interfere with the substrate 118. In order to resolve this interference, the ion beam current sensor 122 is displaced in front of the substrate 118 during processing in direction indicated by arrow 160 in order to monitor the ion beam 108 incident thereon. During implantation process, outgassing from the substrate 118 may occur which can affect monitoring of the ion beam 108 by the ion beam current sensor 122 depending on the position of the ion beam current sensor with respect to the substrate 118. Thus, it is desirable to displace the ion beam current sensor 122 in front of the substrate 118 in the direction of arrow 160 as illustrated at position B' as well as being contiguous with the perimeter of the substrate 118 as it is scanned in order to mitigate the effect of outgassing on beam monitoring.

FIGS. 2A-2D illustrate a top view 200 of a circular wafer representing substrate 118 looking downstream in a direction of travel of the ion beam at various exemplary instances of an ion implant process. More specifically, the views depicted in FIGS. 2A-2D show exemplary movements of the ion beam 108 as a spot beam, the substrate 118, and the ion beam current sensor 122 during an illustrative ion implant process. The surface 118-1 of the substrate 118 to be treated by the ion beam 108 defines a substrate plane 118-a.

In describing the various exemplary positions for the substrate 118 and the ion beam current sensor 122, "initial positions", "first location," and/or "first positions" are described. Use of the terms "initial," "first," "second" are not meant to be limiting. More particularly, an "initial position," "first location" and/or a "first position" as described herein may not necessarily be the starting position during an ion implant process.

FIG. 2A depicts a spot 202, which corresponds to the location at which the ion beam 108 in the form of a spot beam is incident upon the substrate surface 118-1 while the substrate 118 is in a first location 118-a with respect to coordinates on the x and y plane as shown. In other words, FIG. 2A represents the position of substrate 118 at a particular moment in time during processing as the ion beam 108 is scanning the surface 118-1 of the substrate 118. During an ion implant process, the ion beam 108 is scanned in a first direction, such as, for example the direction 140 where the spot 202 moves back and forth in direction 140 forming an exemplary scanned area 206. As described above, in order to implant ions over the entire substrate 118, the substrate 118 moves in a second direction that is orthogonal to the first direction such as, for example, the second direction 150. In order to increase the ion beam utilization, the ion beam current sensor 122 is moved (e.g., via the moveable support 124) in the direction 140 to a first position 122-a, such that the sensor 122 is proximate the perimeter 118-b of substrate 118 as the substrate is moved in direction 150 on the x-y coordinate plane.

For example, the ion beam current sensor 122 is shown disposed a distance away from a portion of the perimeter 118-b of the substrate 118 indicated at 250. During operation, as the substrate 118 is moved in direction 150, the ion beam current sensor 122 moves in direction 140, such that the distance 250 is substantially maintained with respect to the perimeter 118-b of the substrate 118. In other words, the ion beam current sensor 122 may be moved such that the ion beam current sensor 122 "tracks" the perimeter 118-b of the substrate 118 in direction 140 and 150 between points p1 and p2 of the substrate 118 by moving in direction 140 as shown by arrow 140-a. In some examples, this may include moving the ion beam in the direction 140 such that the distance between the ion beam current sensor 122 proximate the platen 116 and the perimeter 118-b of the substrate 118 is maintained. In this manner, the ion beam 118 in the form of a spot beam only need to travel off the substrate surface 118-1 a sufficient distance to be incident on sensor 122 and since the sensor 122 tracks the perimeter of the substrate 118-b, the ion beam only needs to travel off the surface 118-1 of the substrate a distance d in order for it to be sufficiently incident on sensor 122. Accordingly, as will be further explained below, the ion beam utilization may be increased.

The movements of the ion beam 108 and the substrate 118 may be coordinated or controlled to achieve a desired beam dose and uniformity of implantation of the substrate 118. Furthermore, the speed with which the ion beam 108 is scanned back and forth across the surface 188-1 of substrate 118 may be controlled using real time dose control techniques, such as, for example, orthogonal scan compensation (OSC). However, real time dose control techniques rely on intermittently measuring the beam current during the ion implant process. As such, the ion beam current sensor 122 is shown having an aperture 204 configured to receive at least a portion of the ions that comprise the ion beam 108 as it is scanned over the aperture 204. For example, referring briefly back to FIG. 1, the controller 126 may be configured to adjust the speed with which the ion beam 108 is scanned back and forth across the surface 118-1 of substrate 118 such as, for example, by increasing or decreasing the frequency of scanning, or the like. In some examples, the controller 126 may be configured to control the speed with which the drive assembly 110 moves the substrate 118 in direction 150. The controller 126 may adjust the scan speed of the ion beam 108 and/or the movement speed of substrate 118 in direction 150 based on feedback received from the ion beam current sensor 122 in order to control the beam dose and uniformity of ion implantation. It is important to highlight, that the controller 126 may adjust the ion beam 108 scan speed and/or the substrate movement speed while an ion implant process is taking place. Furthermore, the support 124 is configured to move the ion beam current sensor 122 in the direction 140 in conjunction with the movements of the substrate 118 in direction 150 such that the utilization of the ion beam 108 may be increased.

FIG. 2B depicts a spot 202-a, which corresponds to another exemplary location during substrate processing at which the ion beam 108 in the form of a spot beam is incident upon the substrate surface 118-1 while the substrate 118 is in a second location 118-c with respect to coordinates on the x and y coordinate plane as shown. In other words, FIG. 2B represents the position of substrate 118 at another particular moment in time, different from that depicted in FIG. 2A, during processing as the ion beam 108 scans the surface 118-1 of the substrate 118. The ion beam current sensor 122 is shown displaced in direction 150 to a second position 122b, such that the distance 250 between the substrate perimeter 118-b and the sensor 122 is maintained. More particularly, the substrate 118 has a generally circular shape, as such, when the substrate 118 is moved in direction 150 the perimeter 118-c of the substrate 118 will be located at different x and y coordinates as compared to the position of the perimeter 118-b shown in FIG. 2a. The distance the sensor 122 moves will depend on the radius r of the substrate 118 and the displacement of the substrate in direction 150.

In order to increase the ion beam utilization, the ion beam current sensor 122 is moved (e.g., via the moveable support 124) in direction 140 to a second position 122-b such that the sensor 122 is proximate the perimeter 118-c of substrate 118 as the substrate is moved in direction 150 on the x-y coordinate plane as shown. The ion beam current sensor 122 is moved in conjunction with the substrate 118. More specifically, the distance the ion beam current sensor 122 moves in direction 140 may depend upon the geometry and size of the substrate 118 (e.g., radius r). Furthermore, the spot 202-a is scanned over the surface 118-1 of the substrate 118 as well as the ion beam current sensor 122. However, as depicted, due to the movement of the ion beam current sensor 122, the distance the ion beam 108 needs to be scanned to reach the ion beam current sensor is reduced such that the scan area 208 is less than the scanned area 206 shown in FIG. 2A since the current sensor 122 moved from position 122-a to position 122-b. As the substrate 118 moves in direction 150, the ion beam current sensor 122 "tracks" the perimeter 118-b of the substrate 118 in between points p1 and p2 of the substrate 118 by moving in direction 140 as shown by arrow 140-*b*.

Figure 2D:
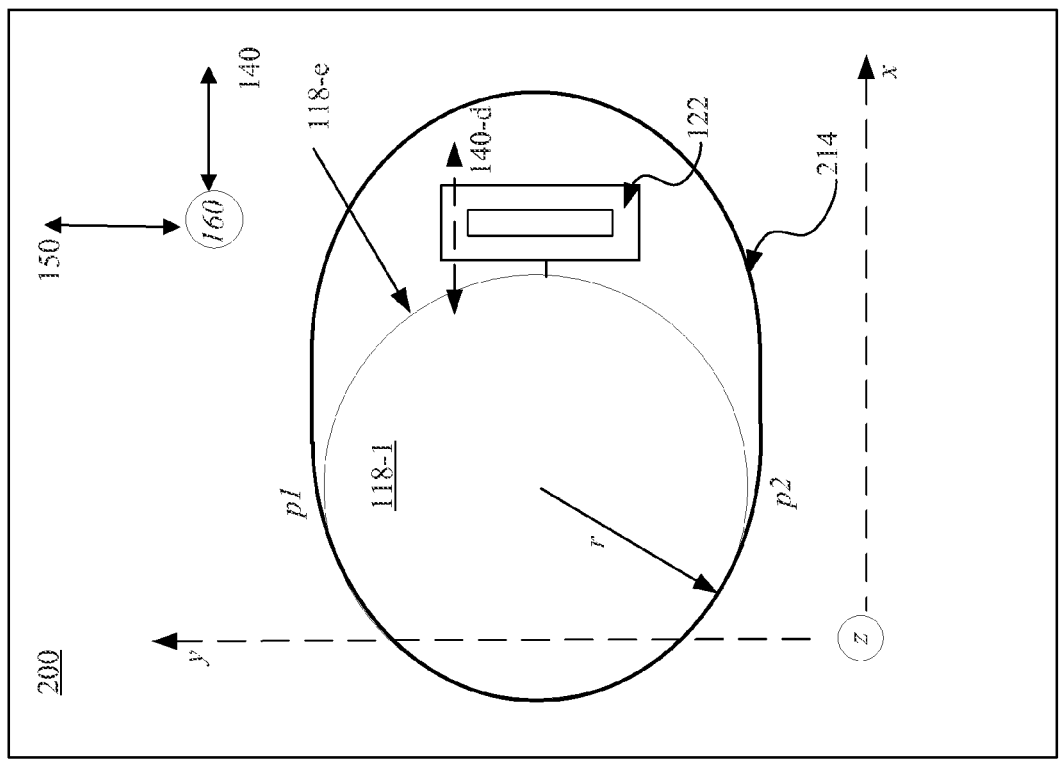
Figure 2C:
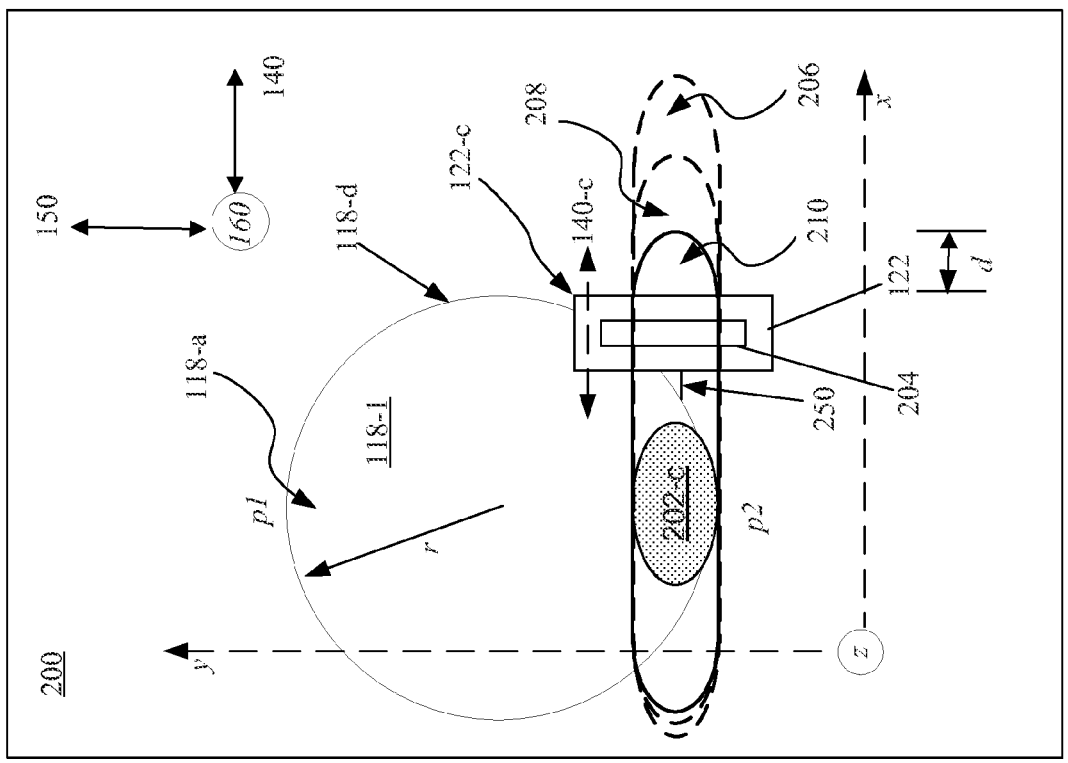

FIG. 2C depicts a spot 202-*c* and a corresponding third exemplary scanned area 210 formed when substrate 118 is in a third position 118-*c* with respect to coordinates on the x, y and z plane as shown. In other words, FIG. 2C represents the position of substrate 118 at a particular moment in time during processing as the ion beam 108 scans the surface 118-1 of the substrate 118. During the implant process, the ion beam 108 is scanned in direction 140 where the spot 202 moves back and forth in direction 140 forming an exemplary scanned area 210. In addition, the substrate 118 moves in direction 150 which is orthogonal to direction 140. Each of directions 140 and 150 are orthogonal to the direction of the ion beam 108 incident on the surface 118-*a* of substrate 118 which is illustrated by direction 160. In order to increase the ion beam utilization, the current sensor 122 is displaced in directions 140 and 160 to a third position 122-*c* such that the distance 250 therebetween is maintained. As noted above with respect to FIG. 1C, the ion beam current sensor 122 is displaced in the direction illustrated by arrow 160 to be disposed in front of substrate 118 with respect to the direction of travel of the ion beam 108. This is done in order to mitigate the effect of outgassing on beam monitoring by the ion beam current sensor 122. As depicted, the ion beam current sensor 122 is disposed in front of a portion of the substrate in order to avoid interference between the ion beam current sensor 122 and the substrate 118 while maintaining the distance 250 between the substrate perimeter 118-*b* and the sensor 122. This ensures that the ion beam 108 in the form of spot 202-*c* is incident on aperture 204 of current sensor 122 a sufficient amount for sensor 122 to detect the associated beam current. Accordingly, the ion beam current sensor 122 is displaced in directions 140 and 160 at position 118-*c* (as well as corresponding points along the substrate perimeter 118-*b*) such that a portion of the ion beam current sensor 122 overlaps or is disposed over a portion of the substrate 118. In this manner, the ion beam current sensor 122 may be configured to move such that the aperture 204 is maintained a desired distance 250 from the perimeter 118-*b* of substrate 118. Furthermore, by displacing the ion beam current sensor 122 in directions 140 and 160 as the substrate is scanned in direction 150, the distance d that the ion beam 108 must be swept past the corresponding perimeter 118-*b* of the substrate 118 in order for it to reach the current sensor 122 is reduced.

When the ion beam current sensor 122 is moved in directions 140 and 160 corresponding to the perimeter 118-*b* of the substrate 118, the area necessary to scan the ion beam 108 across the surface 118-1 changes. More specifically, the area necessary to scan the ion beam 108 across the surface 118-1 and to reach the aperture 204 of the ion beam current sensor 122 is reduced as the substrate 118 is moved in direction 150 and as the spot 202-*c* is scanned back and forth in direction 140. This is particularly illustrated in FIG. 2C, where the first, second, and third exemplary scanned areas 206, 208, and 210 are shown overlaid with each other. As can be seen, the scanned area 210 is less than the scanned area 208 since the current sensor 122 is displaced in direction 140 closer to the perimeter 118-*b* as the substrate is moved in direction 150 closer to point p2 as compared with the position of the current sensor 122 shown in FIGS. 2A and 2B.

FIG. 2D depicts an exemplary total scanned area 214 formed by moving the substrate 118 in direction 150 while the ion beam 108 is scanned in direction 140 and the current sensor 122 is moved in the direction 140 as indicated by arrow 140-*d*. This total scanned area 214 is defined by the sum of the corresponding scanned areas 206, 208, 210 as the ion beam 108 is scanned in direction 140 and the substrate moves in direction 150. As will be appreciated, moving the ion beam current sensor 122 in direction 140 (and direction 160) allows for a reduction in the distance that the ion beam 108 needs to be scanned to reach the ion beam current sensor 122. In other words, the exemplary total scanned area 214 is less comparatively less than the resulting scanned area if the current sensor was stationary. Accordingly, the total scanned area may be reduced, which allows for an increase in the utilization of the ion beam 108.

Figure 3:
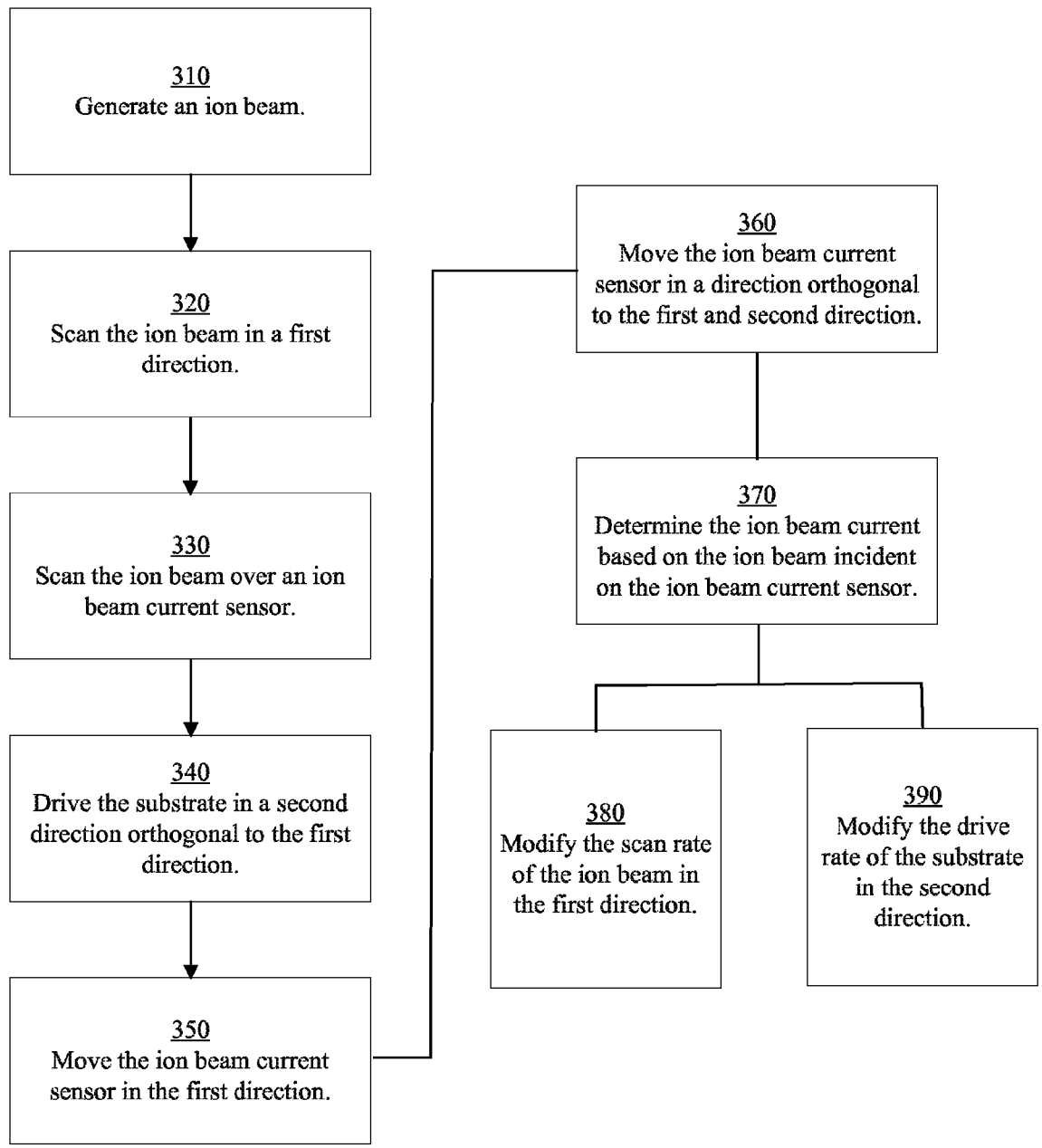
FIG. 3 is a flow chart illustrating a method of implanting ions in a substrate, all arranged in accordance with at least some embodiments of the present disclosure.

FIG. 3 is an exemplary flow chart illustrating a method 300 for implanting ions in a substrate, arranged in accordance with at least some embodiments of the present disclosure. In general, the method 300 is described with reference to the ion implant apparatus 100 and the views 200 shown in FIG. 1 and FIGS. 2A-2D respectively.

The method 300 may begin at block 310 where an ion beam may be generated. For example, the ion beam 108 may be generated. Continuing from block 310 to block 320, the ion beam may be scanned in a first direction. For example, the ion beam 108 may be scanned (e.g., the spot 202 moved) in the x direction across the substrate 118. In some examples, the ion beam 108 may be scanned back and forth in the x direction at a specific frequency (e.g., 1 kHz, or the like). Continuing from block 320 to block 330, the ion beam may be scanned over an ion beam current sensor. For example, the ion beam 108 may be scanned off the substrate 118 and over the ion beam current sensor 122 such that the ion beam 108 is incident upon the aperture 204. Continuing from block 330 to block 340, the substrate may be driven in a second direction such as for example, in the y direction.

Continuing from block 340 to block 350, the ion beam current sensor may be moved in the first direction. In some examples, the ion beam current sensor 122 is moved in the first direction (i.e. direction 140) in response to a relative position of the substrate 118 along the second direction (i.e. direction 150). In some examples, the ion beam current sensor 122 is moved in the first direction while the substrate is moved in the second direction. In some examples, the ion beam current sensor 122 is moved such that the distance (e.g., indicated at 250) between the ion beam current sensor 122 and the substrate 118 is substantially maintained. In some examples, the ion beam current sensor 122 is moved based on a size and geometry of the substrate 118. For example, the substrate geometry of the substrate 118 may be circular with a radius r, as such, the ion beam current sensor 122 can be moved a distance in the first direction dependent upon the radius r. In some examples, the ion beam current sensor 122 is moved such that the utilization of the ion beam 108 is increased. At block 360, the ion beam current sensor is moved in a direction that is orthogonal to both the first and second directions. For example, the ion beam current sensor 122 is displaced in the direction illustrated by arrow 160 to be disposed in front of substrate 118 with respect to the direction of travel of the ion beam 108. The ion beam current is determined based on the ion beam incident on the ion beam current sensor at block 370. The scan rate of the ion beam is modified in the first direction at block 380. For example, the controller 126 may be configured to adjust the speed with which the ion beam 108 is scanned back and forth across the surface 118-1 of substrate 118 such as, for example, by increasing or decreasing the frequency of scanning, or the like. At block 390, the drive rate of the substrate in the second direction is modified. For example, the controller 126 may be configured to control the speed with which the drive assembly 110 moves the substrate 118 in direction 150.

As will be appreciated, scanning the ion beam 108 in the first direction (e.g., at block 320) while the substrate 118 is driven in the second direction (e.g., at block 340) and the ion beam current sensor 122 is moved in the first direction (e.g., at block 350) allows for a reduction in the distance that the ion beam 108 needs to be scanned to reach the ion beam current sensor 122 in some positions. Accordingly, the total scanned area may be reduced (e.g., see FIG. 2D), which allows for an increase in the utilization of the ion beam 108.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

The invention claimed is:

1. An ion implant apparatus comprising:
   an ion source configured to generate an ion beam;
   a scanner configured to scan the ion beam back and forth in a first direction in a scan plane;
   a platen configured to support a substrate when the ion beam is incident on the substrate and configured to drive the substrate in a second direction orthogonal to the scan plane, a front surface of the substrate defining a substrate plane;
   an ion beam current sensor disposed adjacent to the substrate in the substrate plane to detect current during an implant process; and
   a support configured to move the ion beam current sensor in the first direction in response to a relative position of the substrate along the second direction, whereby, during the implant process, the ion beam moves back and forth in the first direction in the scan plane, the platen moves in the second direction, and the ion beam current sensor is moved in the first direction along the scan plane, while the substrate is moved in the second direction, and
   wherein the ion beam current sensor is not disposed between the ion beam and the substrate during the implant process.

2. The ion implant apparatus of claim 1, wherein the support is further configured to move the ion beam current sensor in the first direction such that the distance between an edge of the ion beam current sensor proximate the platen and the substrate is maintained.

3. The ion implant apparatus of claim 1, wherein the substrate has a circular geometry having a perimeter, the support further configured to move the ion beam current sensor a distance in the first direction to track the substrate perimeter as the substrate moves in the second direction.

4. The ion implant apparatus of claim 3, wherein the support is further configured to move the ion beam current sensor in a third direction orthogonal to the first and second directions a distance outside the substrate plane dependent upon the position of the perimeter of the substrate as the substrate moves in the second direction with respect to the ion beam current sensor.

5. The ion implant apparatus of claim 4, wherein the ion beam current sensor moved in the third direction results in the ion beam current sensor being disposed between the substrate plane and a direction of incidence of the ion beam thereon.

6. The ion implant apparatus of claim 3, wherein the support is configured to move the ion beam current sensor in the first and third directions such that a distance between the perimeter of the substrate and the ion beam current sensor is maintained and utilization of the ion beam incident on the substrate is increased.

7. The ion implant apparatus of claim 1, wherein a leading edge of the ion beam current sensor is disposed a distance from a perimeter of the substrate along the first direction.

8. The ion implant apparatus of claim 1, wherein the scanner is configured to scan the ion beam off a surface of the substrate a distance "d" in order for the ion beam to be incident on the ion beam current sensor.

9. The ion implant apparatus of claim 1, wherein the scanner is configured to scan the ion beam off a surface of the substrate a distance "d" in order for the ion beam to be incident on the ion beam current sensor as the ion beam current sensor is displaced in the first and third directions.

10. The ion implant apparatus of claim 9, wherein the substrate has a circular geometry having a perimeter and the scanner being configured to scan the ion beam off a surface of the substrate the distance "d" corresponding to the substrate perimeter.

11. A method for implanting ions in a substrate comprising:
    generating an ion beam;
    scanning the ion beam in a first direction to implant ions into a substrate, wherein a distance traveled by the ion beam in the first direction is related to a relative position of the substrate along a second direction orthogonal to the first direction;
    scanning the ion beam in the first direction past an edge of the substrate and over an ion beam current sensor located adjacent to the substrate;
    driving the substrate in the second direction while the ion beam is scanning in the first direction; and
    moving the ion beam current sensor in the first direction in response to the relative position of the substrate along the second direction, wherein the ion beam current sensor is not disposed between the ion beam and the substrate during the implanting.

12. The method of claim 11, wherein the ion beam current sensor is moved in the first direction while the substrate is moved in the second direction.

13. The method of claim 11, wherein the substrate geometry is circular having a perimeter, the method further comprising moving the ion beam current sensor in a third direction orthogonal to the first and second directions a distance dependent upon the position of the perimeter of the substrate with respect to the ion beam current sensor as the substrate moves in the second direction.

14. The method of claim 11 wherein the ion beam is scanned at a scan rate, the method further comprising:
    monitoring the ion beam current with the ion beam current sensor;
    determining the ion beam current based on the ion beam incident on the ion beam current sensor; and
    modifying the scan rate of the ion beam in the first direction.

15. The method of claim 11 wherein the ion beam is scanned at a scan rate and the substrate is driven at a drive rate, the method further comprising:
    monitoring the ion beam current with the ion beam current sensor;

determining the ion beam current based on the ion beam incident on the ion beam current sensor; and modifying the drive rate of the substrate in the second direction.

16. An ion beam current sensor apparatus comprising:

an ion beam current sensor configured to measure current of an ion beam during an implant process when the ion beam is scanned in a first direction incident on a substrate supported on a platen, the front surface of the substrate defining a substrate plane; and a support configured to move the ion beam current sensor during the implant process in the first direction in response to a relative position of the substrate along a second direction orthogonal to the first direction, wherein the ion beam current sensor is not disposed between the ion beam and the substrate during the implant process.

17. The ion beam current sensor apparatus of claim 16, wherein the support is further configured to move the ion beam current sensor in a third direction orthogonal to the first and second directions such that the ion beam current sensor is disposed between the substrate plane and a direction of travel of the ion beam.

18. The ion beam current sensor apparatus of claim 17, wherein the substrate has a circular geometry having a perimeter, the support further configured to move the ion beam current sensor a distance in the first direction dependent upon the position of the perimeter of the substrate as the substrate moves in the second direction with respect to the ion beam current sensor.

19. The ion beam current sensor apparatus of claim 17, wherein the substrate has a circular geometry having a perimeter, the support further configured to move the ion beam current sensor a distance in the first and third directions such that a distance between the perimeter of the substrate and the ion beam current sensor is maintained and utilization of the ion beam incident on the substrate is increased.

20. The ion beam current sensor apparatus of claim 16, wherein the support is configured to move the ion beam current sensor such that the ion beam is scanned off the substrate plane a distance "d" in order for the ion beam to be incident on the ion beam current sensor.

* * * * *